(12) United States Patent
Weng

(10) Patent No.: US 6,389,573 B1
(45) Date of Patent: May 14, 2002

(54) ENHANCED READ RETRIAL SCHEME

(75) Inventor: Lih-Jyh Weng, Shrewsbury, MA (US)

(73) Assignee: Maxtor Corporation, Longmont, CO (US)

( * ) Notice: Subject to any disclaimer, the term of this patent is extended or adjusted under 35 U.S.C. 154(b) by 0 days.

(21) Appl. No.: 09/343,111

(22) Filed: Jun. 29, 1999

(51) Int. Cl.[7] ............................................. H03M 13/00
(52) U.S. Cl. ..................................................... 714/784
(58) Field of Search ................................. 714/752, 784

(56) References Cited

U.S. PATENT DOCUMENTS 5,715,262 A * 2/1998 Gupta ........................ 714/784

OTHER PUBLICATIONS

Stevens, On decoding unequal error protection product codes, IEEE, pp. 880–895, Jul. 1990.*
Patapoutian et al. The effects of a reread on data reliability, IEEE, pp. 2710–2713, Sep. 1997.*
Peterson et al. Error correcting codes, The MIT Press, pp. 305–308, 1972.*

* cited by examiner

*Primary Examiner*—Albert Decady
*Assistant Examiner*—Shelly A Chase
(74) *Attorney, Agent, or Firm*—Fish & Richardson P.C.

(57) ABSTRACT

A read retrial mechanism which increases the error correction ability of a decoding operation by converting errors to erasures is presented. The mechanism reads at least two copies of a code word from memory and compares corresponding symbols to identify symbol locations for which corresponding symbols are of unequal value. At least one of the code word copies is decoded by an error-erasure decoding operation using the symbol locations identified by the comparison as erasures.

22 Claims, 4 Drawing Sheets

ENHANCED READ RETRIAL SCHEME

BACKGROUND OF THE INVENTION

The invention relates generally to error correction.

Present day storage systems employ a number of different approaches to minimize the number of errors that may occur during a data readback process. In one approach, a storage system rereads the data when uncorrectable errors are detected. Each time the reread operation is performed, the operating conditions are varied slightly, for example, by offsetting the transducer from the center of the track. The reread operations repeat until either the erroneous data are corrected or a predetermined number of reread operations has been performed, at which point the reread process may be terminated in accordance with preset system parameters.

One well-known error correction code that may be used to detect and, if possible, correct the errors which occur in the read data is the Reed-Solomon code. It may be expressed as an (n,k) code where the length of the code word is n symbols and the number of data symbols in the code word is k. The number of redundant symbols corresponds to a check symbol portion r, where $r=n-k$ and the minimum code distance, d, is $d=(n-k)+1$.

In the prior systems which employ conventional Reed-Solomon decoding techniques during the reread or "read retrial" process to correct and detect errors in the read data, the same decoding algorithm that was used to decode the data in the initial read is also used during the read retrial process. That is, during a read retrial, the system performs an error correction decoding algorithm, used to correct t symbol errors, where $t=(d-1)/2$, for each reread operation. If each read contains more than t errors, the correction code is unable to recover the data correctly.

SUMMARY OF THE INVENTION

This invention features a read retrial process for rereading and decoding stored code words, the read retrial process converting errors to erasures to enhance error correction capability during decoding.

Generally, in one aspect of the invention, the read retrial process reads at least two copies of a code word, compares corresponding symbols in the read code word copies to determine which corresponding symbols are unequal, and performs a decoding operation to decode one of the copies using symbol locations for the unequal corresponding symbols.

Embodiments of the invention may include one or more of the following features.

The code word read by the process may be an (n,k) Reed-Solomon code word of a minimum code distance d. Such a Reed-Solomon code word is capable of correcting any combination of errors and erasures (i.e., errors with known locations) as long as the sum of the number of erasures and twice the number of errors is less than the minimum distance d of the code word. Thus, the code word copies are processed as having "erasures"—errors at the symbol locations for the unequal corresponding symbols—by a decoding operation that includes an error-erasure decoding operation. By converting errors to erasures, the error-erasure decoding operation can correct as many as 2t erasures if there are no errors.

The symbol locations may be erasure pointers.

The reads may be consecutive reads.

If the error-erasure decoding operation fails, the other of the read copies may be decoded. If the decoding operations for one or both copies fail, then one or more additional copies may be read and used to produce new erasure pointers.

The read retrial scheme of the invention is quite advantageous in that it tolerates almost twice as many symbol errors as prior read retrial approaches by allowing errors to be processed as erasures by a decoding operation. Thus, the error correction capability of a code word that is read back as part of a read retrial process is increased by increasing the total number of correctable errors from $t=(d-1)/2$ to as many as $d-1$.

Other features and advantages of the invention will be apparent from the following detailed description and from the claims.

DETAILED DESCRIPTION

Figure 1:
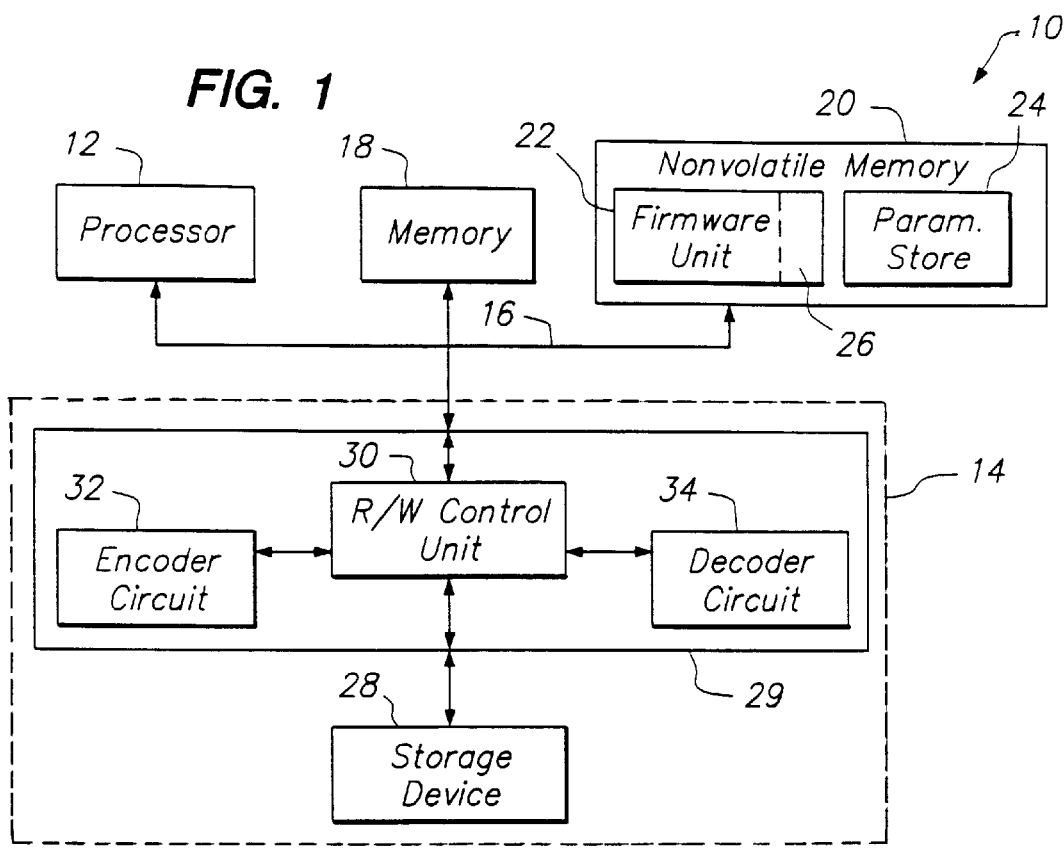
FIG. 1 is a block diagram of a data storage system employing a read retrial process.

Referring to FIG. 1, an exemplary data storage system 10 is shown. The data storage system 10 includes a processor 12 coupled to a mass storage system 14 by way of a bus 16. Also connected to bus 16 are a memory 18 and a nonvolatile memory 20. The processor 12 controls the overall operations of the data storage system 10 and communicates with the memory 18 and the mass storage system 14 via the bus 16. The nonvolatile memory 20 stores system firmware 22 and parameter data in a parameter store 24, and is read each time the data storage system 10 boots. Included as a component of the firmware 22 is a read retrial process 26, which is copied to the memory 18 at initialization for subsequent execution by the processor 12. Stored in the memory 18 are certain data structures, which are created and maintained by the read retrial process 26, as well as other routines as executed by the processor 12. The memory 18 also stores data read from the mass storage system 14.

The mass storage system 14 includes a controller 29, which is coupled to a storage device 28, such as a magnetic tape or disk. Included in the controller 29 are a read/write control unit 30, along with an encoder circuit 32 and a decoder circuit 34. The read/write (R/W) control unit 30 supervises the recording of data on and retrieval of data from the storage device 28. It also directs the encoder circuit 32 to encode data written to the storage device 28 and directs the decoder circuit 34 to decode the coded data as it is read back from the storage device 28. In the described embodiment, the encoder and decoder circuits (32 and 34, respectively) are of the Reed-Solomon type and may be configured in known fashion to perform conventional Reed-Solomon coding algorithms.

The data storage system 10 as thus described with reference to FIG. 1 is intended to illustrate only those aspects of the data storage system 10 which pertain to the read retrial process 26. Hence, some functions are omitted and others simplified to a level appropriate to a discussion of the read retrial process 26 as follows.

Figure 2:
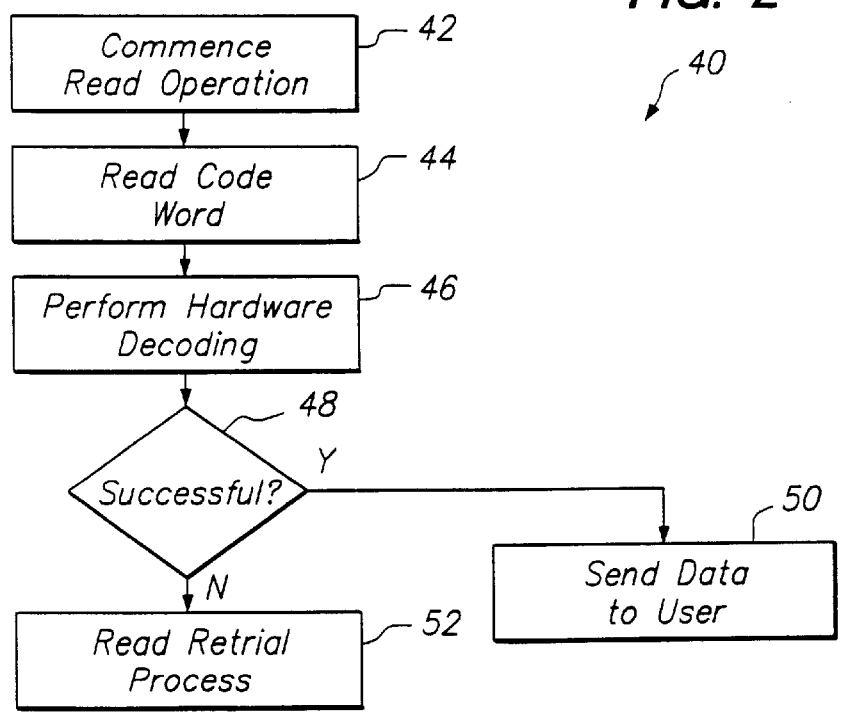
FIG. 2 is a flow diagram of a read operation performed by the data storage system shown in FIG. 1.

Referring to FIG. 2, a flow diagram illustrating the operation of the system 10 (FIG. 1) during a data read operation 40 is shown. In response to a request from a user (not shown in the figures), the processor 12 issues a data request to the R/W control unit 30 (step 42), which retrieves from the storage device 28 at least one code word for the requested data in a conventional manner (step 44). As the code word is a Reed-Solomon code word, the code word includes k data symbols of data error-protected by r redundant symbols. The decoder circuit 34, under the direction of the read/write control unit 30, performs an error decoding operation to detect and correct, if possible, any erroneous data symbols (step 46). If the decoder circuit 34 is able to decode the code word (step 48), i.e., the number of errors is no greater than t for a t-error correcting code, the controller 29 transfers the corrected data (or, error-free data) to the processor 12, which subsequently provides such data to the requestor, e.g., a system user (step 50). If the hardware decoding operation performed by the decoder circuit 34 is unsuccessful (step 48), the controller 29 signals the hardware decoding failure to the processor 12, which responds by executing the read retrial process 26 (step 52). Thus, during an initial read, the system 10 decodes the read data via a hardware decoder, i.e., the decoder circuit 34 (of FIG. 1). If this "first pass" decoding fails, the processor assumes the responsibility for data rereads and therefore any further error correction efforts.

The combination of errors "u" and erasures "v" which can be corrected by a Reed-Solomon code must satisfy the relationship 2u+v<d. Because of the weighting factor 2 in front of the number of errors ("u") in the aforementioned inequality, the total sum of correctable errors, i.e., (# of errors)+(# erasures), will increase if an error can be converted to an erasure. Since one error is equivalent to about two erasures, it will be possible to increase the error correcting ability of a decoding operation without increasing the degree of redundancy of the code itself if a particular error among the errors is handled as an erasure. Thus, a key objective of the read retrial process is to convert errors to erasures. The manner in which this objective is accomplished is discussed below.

Figure 3:
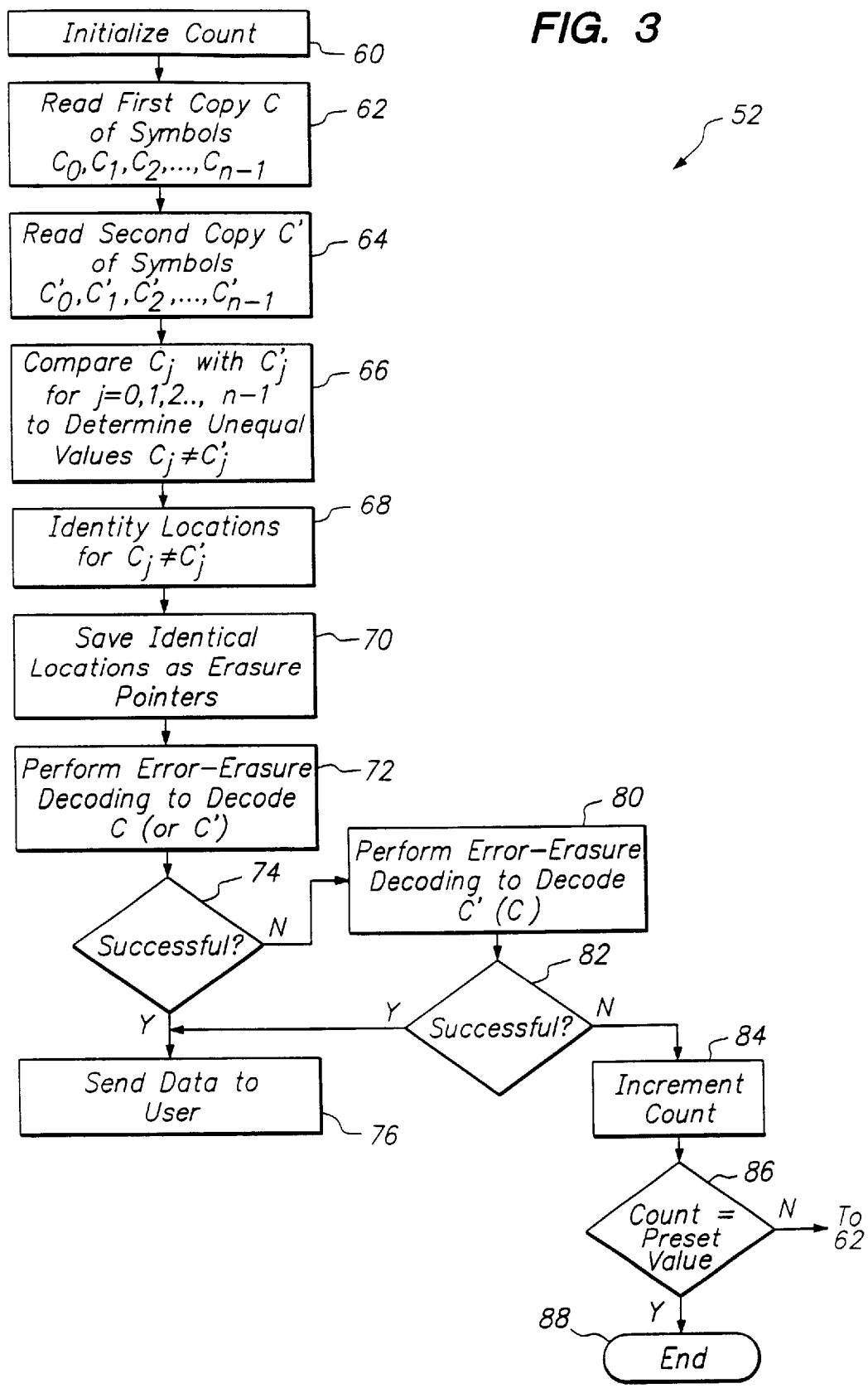
FIG. 3 is a flow diagram of the read retrial process shown in FIGS. 1 and 2.
Figure 4:
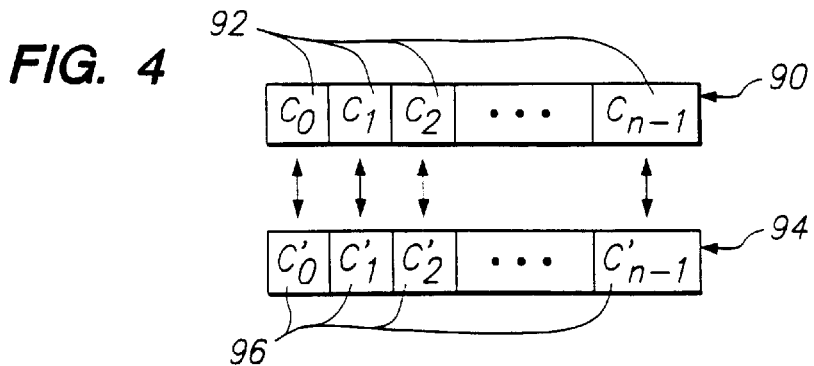
FIG. 4 is a depiction of a symbol-by-symbol comparison of two code word copies read by the read retrial process of FIG. 3.

Referring to FIGS. 3 and 4, the step of performing the read retrial process 52 (from FIG. 2) is shown in detail. Referring to FIG. 3, the process 52 begins by initializing a count to zero (step 60). The process reads (via controller 29) a code word from the storage device 28 as a first copy c having code word symbols $c_0, c_1, c_2, \ldots, c_{n-1}$ (step 62). The process 52 rereads the same code word as a second copy having symbols $c'_0, c'_1, c'_2, \ldots, c'_{n-1}$ (step 64). The read operations are performed consecutively. The process 52 performs a symbol-by-symbol comparison of the copies to identify symbol positions or locations in which the symbol in the code word copy c is unequal to a corresponding symbol in the code word copy c' (step 66). That is, for each symbol location j=0, 1, 2, . . . , n−1, the process compares symbol $c_j$ with symbol $c'_j$ to find unequal corresponding symbols.

Referring to FIG. 4, the symbol-by-symbol comparison of step 66 (of FIG. 3) is depicted. A first read copy 90 includes a plurality of symbols 92, the symbols shown as $c_0$ through $c_{n-1}$. A second read copy 94 includes a plurality of symbols 96, the symbols shown as $c'_0$ through $c'_{n-1}$. As indicated by the arrows, symbols in corresponding positions 0 through n−1 are compared. That is, $c_0$ is compared to $c'_0$, $c_1$ is compared to $c'_1$, $c_2$ is compared to $c'_2$, and so forth.

Returning to FIG. 3, the process 52 identifies all locations for which $c_j \neq c'_j$ (step 68). These locations with unequal read symbols are the locations of erasures. The identified locations associated with the unequal read symbols (that is, $c_j \neq c'_j$) are collected as erasure locations and may be stored as erasure pointers in the memory 18 (step 70).

Subsequently, the process 52 retrieves the erasure pointers and performs an error-erasure decoding operation using the erasure locations 72. If the decoding operation successfully corrects the errors (step 74), the error-free data is provided to the user (step 76).

It should be noted that two unequal symbols from successive reads may both be incorrect, but it is also possible that only one is correct. Thus, in decoding one copy having the correct symbol, the process may, in fact, be treating a good symbol as an erasure and thus adding to the total number of errors. Therefore, if the decoding operation fails (step 78), then the process repeats the decoding operation for the other code word copy (step 80). If this decoding operation is successful (step 82), the process is completed a described above (step 76). That is, the corrected data is sent to the data requester.

If the second decoding operation fails, then the count for tracking reread attempts for given sets of pointers produced as a result of successive reads is incremented (step 84) and compared to a preset threshold value (step 86). If the count equals the preset threshold value, the process terminates (step 88). If the count is less than the preset threshold value, the process returns to step 62. In other words, the process continues to read and compare copies, produce erasure pointers and decode one or both copies using the pointers until read data is successfully decoded (either detected as error-free or corrected) or the process reaches an unacceptable number of re-read/decode attempts and thus terminates as a result.

Alternatively, instead of decoding the other copy, the process could simply return to step 62 after step 74 and begin again by reading new copies c and c'.

Figure 5:
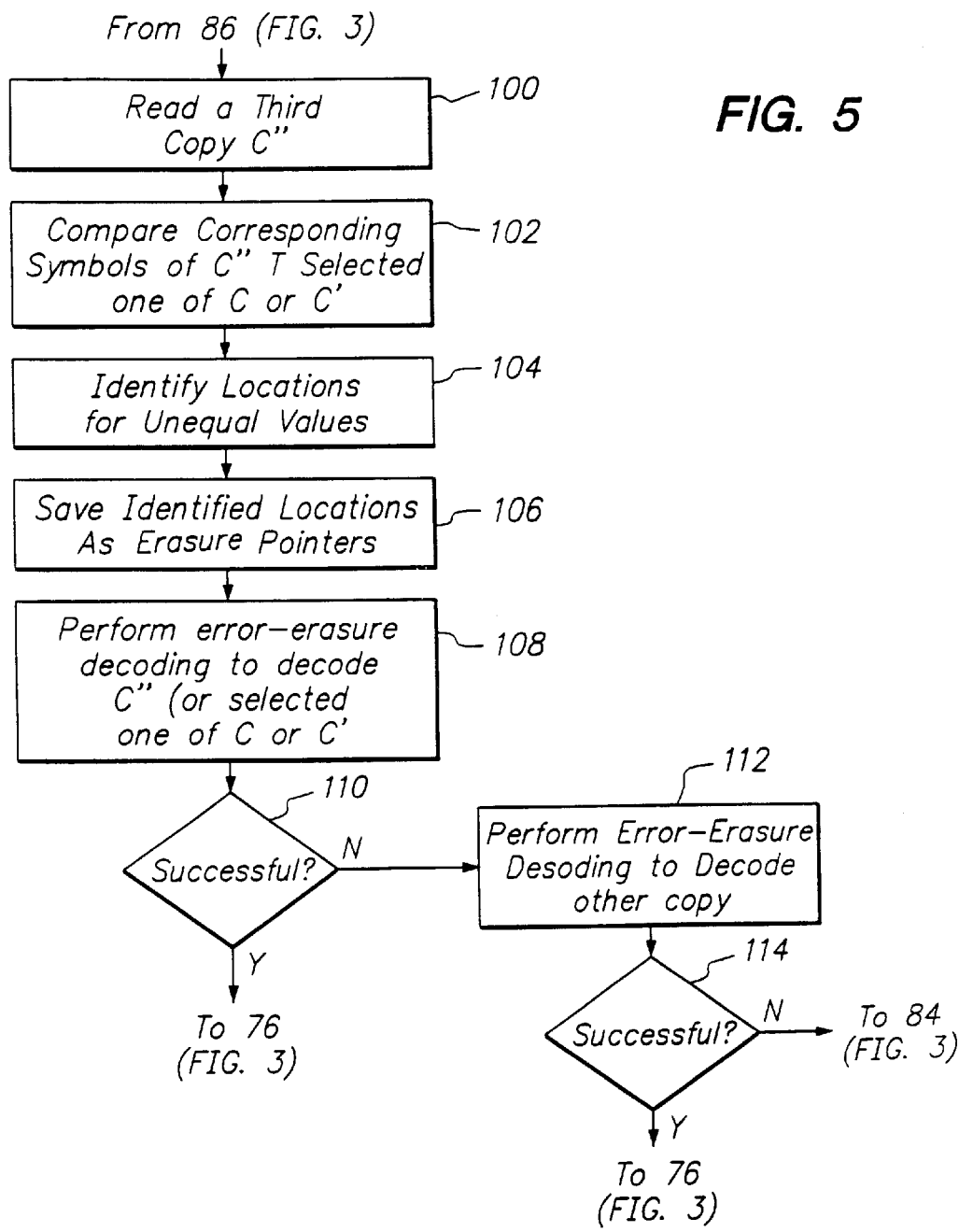
FIG. 5 is a flow diagram of an alternative read retrial process.

Other embodiments are contemplated. For example, as shown in FIG. 5, after failed attempts to decode either one or both copies (at steps 74 or step 86, respectively), the process may read another copy and compare the new copy to one of the previously read copies. That is, instead of returning to step 62 (of FIG. 3) to read two new copies, the process 52 performs another read (step 100) and compares the read symbol c" to one of the two sets of symbols from the previous two reads (step 102). It again performs the symbol-by-symbol comparison, this time for the new code word copy c" and a selected one of the previously read copies, i.e., c or c'. The process 52 uses the results of the comparison to identify erasure locations (step 104) and, optionally, saves the erasure locations as pointers for the decoding operation (step 106). At step 108, the process 52 performs an error-erasure decoding operation to decode c" (or, alternatively, the selected one of the previously read copies). If the operation is successful (step 110), the process ends at step 76 (FIG. 3). If unsuccessful, the process may decode the other copy (c" or the selected one of c, c', whichever copy was not decoded at step 108) at step 112, or returns to step 84 (FIG. 3). If the second decoding operation is performed and is successful (step 114), the process ends at step 76 (FIG. 3). If unsuccessful (at step 112), the process returns to step 84 of FIG. 3 (to adjust the count and then return to step 62 of FIG. 3 step 100 of FIG. 5).

In other embodiments, the count mechanism may be modified or eliminated altogether. That is, the process 52 may perform steps 62 through 82 and quit at step 88. The use of a preset threshold value as well as the selection of that preset threshold value are matters of design choice and thus may be arbitrary or a function of the system performance requirements.

It will be appreciated that the above-described process may be implemented in a variety of ways as long as at least two different (and not necessarily consecutive) reads of the same code word are used to convert at least one error to an erasure.

Figure 6:
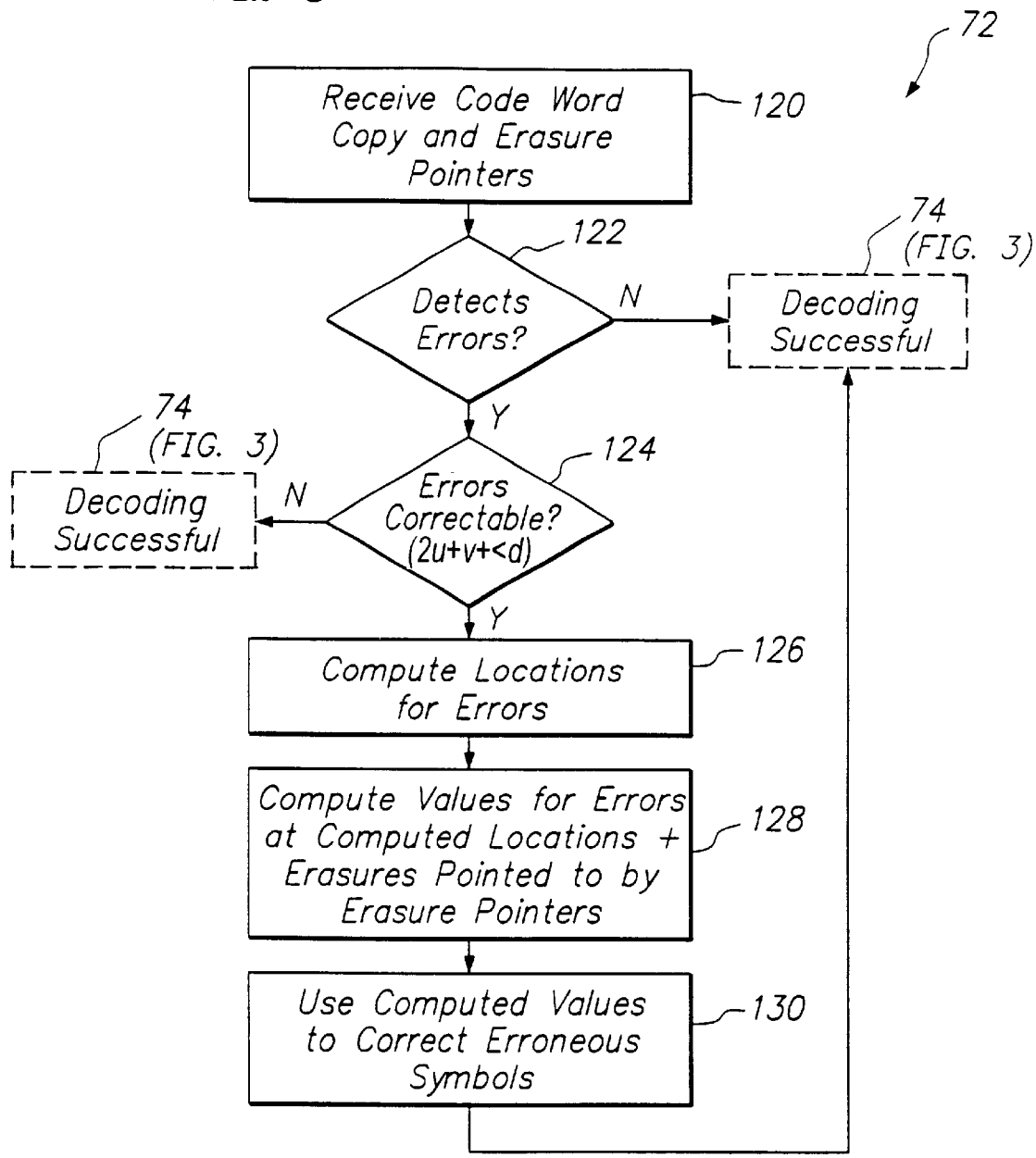
FIG. 6 is a flow diagram of an error-erasure decoding process performed by the read retrial processes shown in FIGS. 3 and 5.

The error-erasure decoding process (referred to as "software decoder") which is used in steps 72, 80 (FIG. 3) and 108, 112 (FIG. 5) is shown in FIG. 6. For simplicity, it is shown in FIG. 6 as error-erasure decoding process or software decoder 72. The software decoder 72 receives the code word copy to be decoded and the erasure pointers produced as described above (step 120). The software decoder determines if the code word contains errors (step 122). If the code word does not contain erroneous symbols, the decoding operation is considered successful. This successful/unsuccessful determination corresponds to any of steps 74, 82 of FIG. 3, as well as steps 110, 114 of FIG. 5, but is shown in FIG. 5 in dashed lines as step 74 for the sake of simplicity and in keeping with the description of the software decoder 72. If the code word contains errors, i.e., errors and erasures, the decoder detects the number of errors and erasures and determines if the code word is correctable, that is, if 2u errors plus v erasures is less than the minimum code distance d (step 124). If the code word is not correctable, then the operation has failed (step 74).

If the data symbols are correctable by the code, the software decoder computes the locations for the errors only (step 126), as the erasure locations are already known, and computes the values for errors at the computed error locations and values for the erasures pointed to by the erasure pointers (step 128). The computed locations and values for erroneous symbols (errors and erasures) are used by the software decoder to correct those symbols (step 130) and the decoding operation is successfully completed (step 74).

The error-erasure decoding process of FIG. 6 can be any one of a number of conventional error-erasure decoding algorithms. Details of such error-erasure decoding techniques can be found in "Error-Correcting Codes" by W. Wesley Peterson and E. J. Weldon, Jr., (The MIT Press, 1972), pps. 305–308, as well as U.S. Pat. No. 5,715,262, in the name of Alok Gupta, incorporated herein by reference, and other sources.

The erasure pointers produced by the read retrial process described above are accurate in that they correspond to true erasures. In other words, if the erasure pointer indicates that a symbol is an erasure, the probability that a particular symbol contains an error is approximately equal to the symbol error rate. On the other hand, a new symbol error will be produced only when two successive reads are both incorrect; however, when a symbol is read incorrectly in two successive reads, the probability of the two reads yielding the same symbol is not high in most cases unless the two reads are completely correlated. For further discussion of error event probability in relation to successive reads, reference may be had to a paper by Ara Patapoutian and Mathew P. Vea, entitled "The Effect of a Reread on Data Reliability," IEEE Transactions on Magnetics, Vol. 33, No. 2, September 1997, pp. 2710–2713, which is incorporated herein by reference.

What is claimed is:

1. A method of reading a stored code word, the code word having a plurality of symbols and each symbol in the plurality of symbols having a symbol location, comprising:
   reading at least two copies of the code word;
   comparing corresponding symbols in the at least two copies to determine which corresponding symbols are unequal;
   identifying symbol locations for the unequal corresponding symbols; and
   performing a decoding operation to decode one of the at least two copies using the identified symbol locations.

2. The method of claim 1, wherein the code word is a t-error correcting Reed-Solomon code word and the number of errors that may be correctable by the decoding operation is greater than t.

3. The method of claim 2, wherein performing the decoding operation includes performing an error-erasure decoding operation using the identified symbol location, whereby the number of errors that are correctable by the error-erasure decoding operation increases by one for each of the identified symbol locations.

4. The method of claim 1, further comprising:
   determining if the decoding operation is successful; and
   if the decoding operation is unsuccessful, repeating the decoding operation for the other of the at least two copies using the identified symbol locations.

5. The method of claim 4, further comprising:
   determining if the repeated decoding operation is successful; and
   if the repeated decoding operation is unsuccessful, performing the steps of:
      reading a third copy;
      comparing symbols in the third copy to corresponding symbols in one of the at least two copies to determine which corresponding symbols are unequal;
      identifying symbol locations for the unequal corresponding symbols; and
      performing a decoding operation to decode the third copy using the identified symbol locations.

6. The method of claim 1, further comprising:
   determining if the decoding operation is successful; and
   if the decoding operating is unsuccessful, performing the steps of:
      reading a third copy;
      comparing symbols in the third copy to corresponding symbols in a stored one of the at least two copies to determine which corresponding symbols are unequal;
      identifying the symbol locations for the unequal corresponding symbols; and
      performing a decoding operation to decode the third copy using the identified symbol locations.

7. The method of claim 6, further comprising:
   determining if the decoding operation to decode the third copy is successful; and
   if the decoding operation to decode the third copy is unsuccessful, then repeating the decoding operation for the stored one of the at least two copies using the identified symbol locations.

8. The method of claim 1, further comprising:
   determining if the decoding operation is successful.

9. The method of claim 8, further comprising:
   repeating the steps of reading, comparing, identifying, performing and determining until the number of unsuccessful decoding operations performed using the symbol locations based on different ones of the comparisons reaches a preset threshold value.

10. The method of claim 1, wherein the reads are consecutive reads.

11. The method of claim 1, wherein the identified locations are stored as erasure pointers.

12. An apparatus for reading a stored code word, the code word having a plurality of symbols and each symbol in the plurality of symbols having a symbol location, comprising:
   a stored computer program in memory instituting the steps of:
     reading at least two copies of the code word;
     comparing corresponding symbols in the at least two copies to determine which corresponding symbols are unequal;
     identifying symbol locations for the unequal corresponding symbols; and
     performing a decoding operation to decode one of the at least two copies using the identified symbol locations.

13. The apparatus of claim 12, wherein the code word is a t error correcting Reed-Solomon code word and the number of errors that may be correctable by the decoding operation is greater than t.

14. The apparatus of claim 13, wherein the program instituted step of performing the decoding operation includes performing an error-erasure decoding operation using the identified symbol location, whereby the number of errors that are correctable by the error-erasure decoding operation increases by one for each of the identified symbol locations.

15. The apparatus of claim 12, further wherein the program institutes the steps of:
   determining if the decoding operation is successful; and
   if the decoding operation is unsuccessful, repeating the decoding operation for the other of the at least two copies using the identified symbol locations.

16. The apparatus of claim 15, further wherein the program institutes the steps of:
   determining if the repeated decoding operation is successful; and
   if the repeated decoding operation is unsuccessful, performing the steps of:
     reading a third copy;
     comparing symbols in the third copy to corresponding symbols in one of the at least two copies to determine which corresponding symbols are unequal;
     identifying symbol locations for the unequal corresponding symbols; and
     performing a decoding operation to decode the third copy using the identified symbol locations.

17. The apparatus of claim 12, further wherein the program institutes the steps of:
   determining if the decoding operation is successful; and
   if the decoding operating is unsuccessful, performing the steps of:
     reading a third copy;
     comparing symbols in the third copy to corresponding symbols in a stored one of the at least two copies to determine which corresponding symbols are unequal;
     identifying the symbol locations for the unequal corresponding symbols; and
     performing a decoding operation to decode the third copy using the identified symbol locations.

18. The apparatus of claim 17, further wherein the program institutes the steps of:
   determining if the decoding operation to decode the third copy is successful; and
   if the decoding operation to decode the third copy is unsuccessful, then repeating the decoding operation for the stored one of the at least two copies using the identified symbol locations.

19. The apparatus of claim 12, further wherein the program institutes the steps of:
   determining if the decoding operation is successful.

20. The apparatus of claim 19, further wherein the program institutes the steps of:
   repeating the steps of reading, comparing, identifying, performing and determining until the number of unsuccessful decoding operations performed using the symbol locations based on different ones of the comparisons reaches a preset threshold value.

21. The apparatus of claim 12, wherein the reads are consecutive reads.

22. The apparatus of claim 12, wherein the identified locations are stored as erasure pointers.

* * * * *